(12) United States Patent
Christanto et al.

(10) Patent No.: US 12,169,059 B2
(45) Date of Patent: Dec. 17, 2024

(54) LIGHTING STRIP

(71) Applicant: SIGNIFY HOLDING B.V., Eindhoven (NL)

(72) Inventors: Andrew Christanto, Shanghai (CN); Hang Li, Shanghai (CN); Hao Zhang, Shanghai (CN); Weihua Miao, Shanghai (CN); Sheng Feng Li, Shanghai (CN); Ashley Cannell, Langley (CA); Ryan Robert Gates, Langley (CA)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 17/927,922

(22) PCT Filed: Jul. 8, 2021

(86) PCT No.: PCT/EP2021/069010
§ 371 (c)(1),
(2) Date: Nov. 28, 2022

(87) PCT Pub. No.: WO2022/008663
PCT Pub. Date: Jan. 13, 2022

(65) Prior Publication Data
US 2023/0228411 A1  Jul. 20, 2023

(30) Foreign Application Priority Data

Jul. 9, 2020 (WO) ................ PCT/CN2020/101159
Aug. 18, 2020 (EP) ..................................... 20191471

(51) Int. Cl.
*F21V 23/00* (2015.01)
*F21Y 113/13* (2016.01)
(Continued)

(52) U.S. Cl.
CPC ........... *F21V 23/005* (2013.01); *H05K 1/181* (2013.01); *F21Y 2113/13* (2016.08);
(Continued)

(58) Field of Classification Search
CPC .... F21S 4/28; F21S 4/22; F21S 2/005; H05K 1/0298; H05K 2201/0909; H05K 2201/09127
See application file for complete search history.

(56) References Cited

U.S. PATENT DOCUMENTS 5,107,408 A    4/1992 Vernondier
8,007,286 B1*  8/2011 Holec ...................... H05K 1/14
                                                       439/65
(Continued)

FOREIGN PATENT DOCUMENTS

EP    0818652 B1    12/2002
EP    2501208 A2    9/2012
(Continued)

*Primary Examiner* — William N Harris

(57) ABSTRACT

A lighting strip has a printed circuit board with one or more perforated lines at which the printed circuit board length may be adjusted by breaking off an end portion of the printed circuit board. A first layer has a first set of conductive tracks and a second layer has a second set of conductive tracks corresponding to the first set of conductive tracks. Each conductive track of the second set is vertically aligned and positioned over the corresponding conductive track of the first set. An array of contact terminals is provided on a third layer. A plurality of lighting elements is disposed along the lighting strip, each electrically connected to a respective pair of the contact terminals. The lighting strip further comprises a set of vias connecting each conductive track of the first set to the corresponding conductive track of the second set.

14 Claims, 3 Drawing Sheets

(51) Int. Cl.
*F21Y 115/10* (2016.01)
*H05K 1/02* (2006.01)
*H05K 1/18* (2006.01)

(52) U.S. Cl.
CPC ......... *F21Y 2115/10* (2016.08); *H05K 1/0298* (2013.01); *H05K 2201/0909* (2013.01); *H05K 2201/09127* (2013.01); *H05K 2201/10106* (2013.01)

(56) References Cited

U.S. PATENT DOCUMENTS

| | | |
|---|---|---|
| 10,030,828 B2 | 7/2018 | Meir |
| 2012/0063139 A1* | 3/2012 | Benkart ................. H05K 3/40 362/249.02 |
| 2012/0276758 A1 | 11/2012 | Donauer et al. |
| 2015/0338069 A1 | 11/2015 | Tamura et al. |
| 2018/0320871 A1 | 11/2018 | Clawson et al. |
| 2020/0053875 A1 | 2/2020 | Holec et al. |
| 2020/0404791 A1* | 12/2020 | Lin ..................... H01L 25/0753 |

FOREIGN PATENT DOCUMENTS

| | | |
|---|---|---|
| EP | 2615653 A1 | 7/2013 |
| WO | 2020043727 A1 | 3/2020 |

* cited by examiner

LIGHTING STRIP

CROSS-REFERENCE TO PRIOR APPLICATIONS

This application is the U.S. National Phase application under 35 U.S.C. § 371 of International Application No. PCT/EP2021/069010, filed on Jul. 8, 2021, which claims the benefits of European Patent Application No. 20191471.0, filed on Aug. 18, 2020 and Chinese Patent Application No. PCT/CN2020/101159, filed on Jul. 9, 2020. These applications are hereby incorporated by reference herein.

FIELD OF THE INVENTION

This invention relates to lighting strips, in particular a lighting strip which can be reduced to a desired length.

BACKGROUND OF THE INVENTION

Solid state lighting (SSL) element-based lighting applications require more and more flexibility. As such there is a rapid increase of variations of linear, elongate substrates such as PCBs (printed circuit boards) with surface mounted SSL elements. There is a desire for increasingly narrow lighting strips. In particular, in high-end professional luminaires, the form factor and look-and-feel is very important. Slimmer and sleeker luminaires are considered to be particularly attractive. However, when narrow lighting strips are formed using a printed circuit board, there can be insufficient space on the printed circuit board for the conductive tracks needed to supply power to the SSL elements. This is particularly the case if a multi-channel solution is desired. A multi-channel solution allows white point control or even color control. At present, single layer printed circuit boards below 20 mm in width are not available for multi-channel solutions.

A single layer-multiple channel lighting strip usually utilizes zero-ohm resistors as bridges to jump from power lines to the LEDs footprint. These bridges can obstruct the use of secondary optics such as light guides and lenses. It is therefore preferable to provide lighting strips without additional components on the top layer to avoid obstructions on secondary optics.

It is also preferable to have lighting strips in lengths as long as possible to avoid the need for multiple joints, for example of length 1000 mm or more. The joints of light strips usually involves multiple connectors and they can also obstruct the use of secondary optics. Such lighting strips however need to be able to be shortened so that they can be used in a greater range of applications, or so that multiple lighting strips may be combined to reach an exact desired overall length.

The problems of high resistance caused by narrow conductive tracks and by long conductive tracks thus compound. Narrow power lines will have too high resistance to carry a drive current along such a long lighting strip without causing current imbalance. There is therefore a need for a very slim and long multi-channel lighting strip with adjustable length, and that can carry current sufficiently uniformly throughout the lighting strip. The design must also be safe to operate after the length is adjusted (by breaking the printed circuit board), whereby no short can occur.

SUMMARY OF THE INVENTION

The invention is defined by the claims.

According to examples in accordance with an aspect of the invention, there is provided a lighting strip, comprising:
a strip-shaped printed circuit board which includes:
one or more perforated lines at which the printed circuit board length may be adjusted by breaking off an end portion of the printed circuit board;
a first layer having a first set of conductive tracks;
a second layer provided over the first layer, having a second set of conductive tracks corresponding to the first set of conductive tracks, wherein each conductive track of the second set is vertically aligned and positioned over the corresponding conductive track of the first set; and
a third layer provided over the second layer, having an array of contact terminals; and
a plurality of lighting elements disposed along the lighting strip, each electrically connected to a respective pair of the contact terminals.

The lighting strip further comprises a set of vias connecting each conductive track of the first set to the corresponding conductive track of the second set. The conductive tracks are thus coupled in pairs to reduce the resistance.

The use of two layers with corresponding conductive tracks reduces the voltage drops across those conductive tracks, so enables narrow power supply lines to be used, while still enabling a sufficiently uniform light output along the strip. In this way, a small overall width is possible while providing multiple channels. Each channel is then for driving a sub-set of the lighting elements along the lighting strip, for example to enable white point control or even color control. The conductive tracks may comprise power supply lines and ground lines.

The strip is designed to have user-selectable length, in that an end portion can be broken off. By having overlapping corresponding conductive tracks, any vertical short between the second and third layers, which may result from the breaking process, does not change the function of the lighting strip. In particular, when breaking the printed circuit board along the perforated line, tracks may be shorted on different layers of the PCB. Tracks are "corresponding" in different layers in that they have the same polarity, and are connected to a same terminal, e.g. a same power supply terminal. Each conductive track of the second set is preferably positioned over the corresponding conductive track of the first set over its full length. This means vertical vias may be made between the corresponding tracks at any point along their length.

The break can preferably be made with no tooling.

The lighting elements may be grouped into a plurality of channels, each channel being associated with a first conductive track which functions as a high supply line and a second conductive track which functions as a low supply line, on each of the first and second layers.

Thus, each channel has opposite polarity supply lines on each of the first and second layers. Thus, each polarity of the power supply is routed over a pair of conductive tracks to reduce the resistance.

There may be exactly two channels of lighting elements, a first channel comprising warm white lighting elements and a second channel comprising cool white lighting elements. This enables white point control of the output from the lighting strip by selecting suitable drive levels for the channels.

The conductive track designs of the first and second layers, and indeed the overall layer designs, may be identical, in other words, have the same layout. This reduces the number of different components in the design.

Each lighting element for example comprises an LED or an array of LEDs. This enables a low power and low cost lighting strip.

Each via preferably also connects a lighting element to an associated conductive track of each of the first and second sets. Thus, the conductive tracks are connected together and to the lighting element at each lighting element location, so that the pairs of tracks form a parallel pair between each adjacent lighting element along the strip.

Each lighting element, or a series string of lighting elements, is preferably connected by a first via to first conductive tracks in each of the first and second layers, which function as a positive supply line, and by a second via to second conductive tracks in each of the first and second layers, which function as a negative supply line. Note that "positive" and "negative" are only used as relative terms. For example one may be held at a ground voltage and the other may be at a positive voltage.

The vias are for example partially buried vias which terminate generally at the conductive tracks of the first layer. In this way, the vias do not extend to the bottom surface of the lighting strip. This bottom surface may thus function as an insulating support.

The printed circuit board may further comprise an insulating base layer beneath the first layer (i.e. at the opposite side of the first layer to the lighting elements). This provides an insulating support layer as part of the structure of the printed circuit board. The use of partial buried vias means that this layer provides an insulating support without the vias extending into the base layer. This insulation could instead be provided by a separate insulating layer which does not form part of the structure of the printed circuit board.

The lighting strip for example has a width less than 20 mm, for example in the range 8 mm to 12 mm. The invention enables two (or more) channels to be provided despite this narrow width, by duplicating conductive tracks the first and second layers of the printed circuit board.

The lighting strip may have a length more than 1000 mm. The length is for example 1210 mm (4 feet) or 1513 mm (5 feet) or any other length. The reduced resistance discussed above allows current to be supplied to the lighting elements along the full length of the lighting strip.

The lighting strip may further comprise a current driver circuit for delivering current to the lighting elements from one end of the printed circuit board. The multiple conductive tracks enable the current to be more equally distributed between the lighting elements.

The printed circuit board is preferably a rigid printed circuit board, such as an FR4 board.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
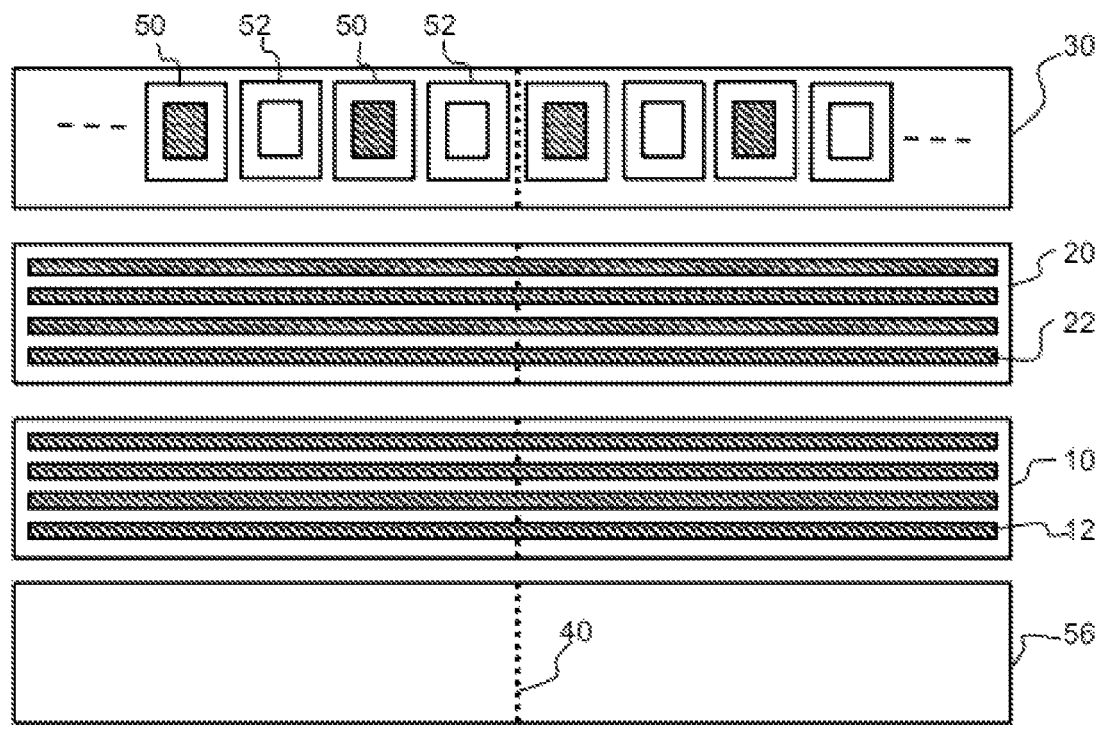
FIG. 1 shows an example of a lighting strip in accordance with the invention, in exploded view to show the layers of the structure.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a lighting strip which has a printed circuit board with one or more perforated lines at which the printed circuit board length may be adjusted by breaking off an end portion of the printed circuit board. A first layer has a first set of conductive tracks and a second layer has a second set of conductive tracks corresponding to the first set of conductive tracks. Each conductive track of the second set is positioned over the corresponding conductive track of the first set such they are vertically aligned with respect to the light strip (or printed circuit board) surface. An array of contact terminals is provided on a third layer. A plurality of lighting elements is disposed along the lighting strip, each electrically connected to a respective pair of the contact terminals.

FIG. 1 shows an example of a lighting strip in accordance with the invention, in exploded view to show the layers of the structure.

The lighting strip comprise a strip-shaped printed circuit board having three main layers and an optional base layer as a fourth layer. The circuit board is for example a rigid FR4 (glass-reinforced epoxy laminate) board.

A first layer 10 has a first set of conductive tracks 12. In this example, there are four conductive tracks. These define a high supply line (e.g. a power supply line) and a low supply line (e.g. a ground return line) for a first channel, and a high supply line (e.g. a power supply line) and a low supply line (e.g. a ground return line) for a second channel. Thus, the conductive tracks form a pair of power supply lines for each of two channels. The conductive tracks for example have a width in the range 1 mm to 2 mm.

A second layer 20 is provided over the first layer, having a second set of conductive tracks 22. These correspond to the first set of conductive tracks. By this is meant the same set of signals is carried by the second set as the first set. They preferably also have the same widths and layout. Each conductive track of the second set is then positioned over the corresponding conductive track of the first set. As explained below, these corresponding pairs of conductive tracks are electrically connected together. The first and second layers are preferably identical. This reduces the number of different components in the design.

A third layer 30 is provided over the second layer 20. It has an array of contact terminals (not seen in FIG. 1 as they are beneath the lighting elements).

One more perforated line 40 is provided at which the printed circuit board length may be adjusted by breaking off an end portion of the printed circuit board. The perforated line 40 comprises a line of through holes. The correspondence between pairs of conductive tracks at least in the vicinity of the perforated line or lines prevents unwanted shorts when performing a break.

The through holes may be positioned between the conductive tracks so that they do not increase the resistance of the conductive tracks themselves. However, the narrow width of the conductive tracks means that the printed circuit board may be broken manually along the perforation without use of any tools.

When the lighting strip is broken to length, any vertical short between the second and third layers, which may result from the bending and breaking process using the perforation, does not change the function of the lighting strip. The conductive tracks which are vertically aligned are in any case electrically connected together.

A plurality of lighting elements 50, 52 is disposed along the lighting strip. Each lighting element is electrically connected to a respective pair of the contact terminals.

The use of two layers with corresponding conductive tracks reduces the voltage drops across those tracks, so enables narrow power supply conductive tracks to be used, while still enabling a light output along the strip. In this way, a small overall width is possible while providing multiple channels. Each channel is then for driving a sub-set of the lighting elements along the lighting strip.

The use of two channels as shown for example enables white point control. Thus, the first channel may comprise warm white lighting elements 50 and the second channel may comprise cool white lighting elements 52.

Three channels could be used for full color control. Thus, in general each channel will be associated with a first conductive track which functions as a high supply line and a second conductive track which functions as a low supply line, on each of the first and second layers. The conductive track resistance is reduced by connecting tracks in parallel both for the power supply lines along which current is delivered from a driver and the power return lines along which current is returned to the driver.

In the example shown, the printed circuit board further comprises an insulating base layer 56. This provides an insulating support layer as part of the structure of the printed circuit board.

Figure 2:
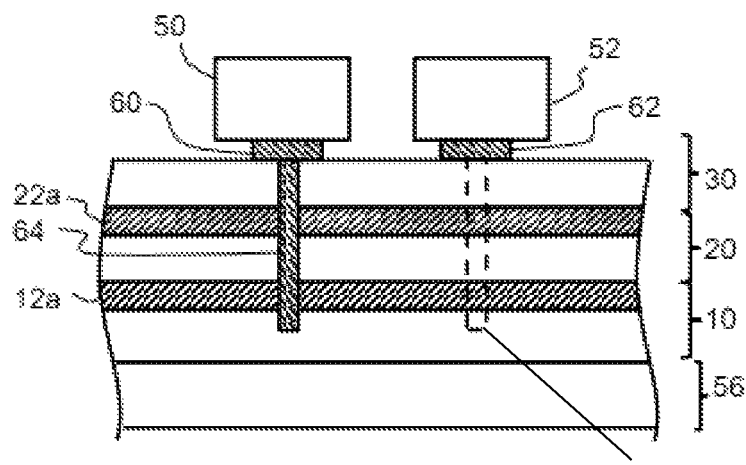
FIG. 2 shows a cross section along the lighting strip of FIG. 1.
Figure 3:
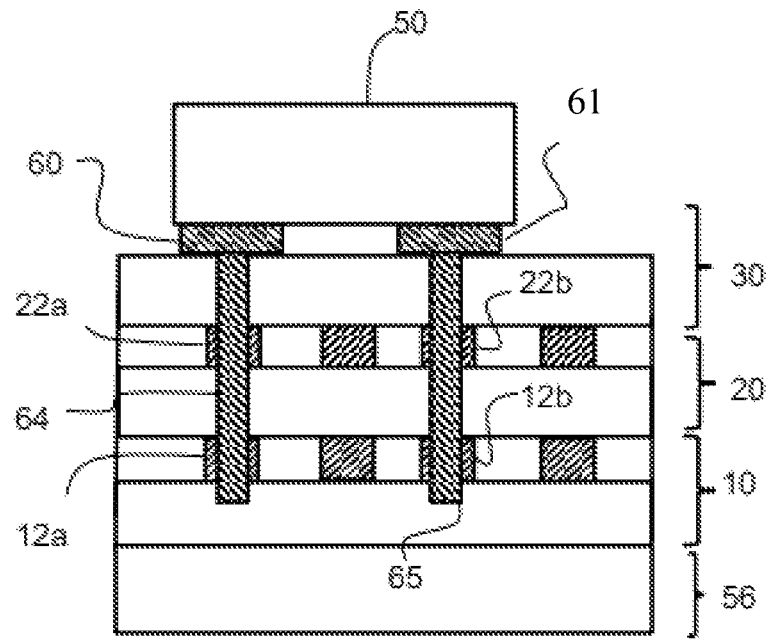
FIG. 3 shows a cross section across the lighting strip of FIG. 1.

FIG. 2 shows a cross section along the lighting strip and FIG. 3 shows a cross section across the lighting strip.

The lighting strip comprises a set of vias connecting each conductive track of the first set to the corresponding conductive track of the second set. The conductive tracks are thus coupled in pairs to reduce the resistance.

There are two vias 64 and 64' and respective contact terminal 60 and 62, for each lighting element, one of which is shown for each of the two lighting elements 50, 52, and shown in FIG. 2 along the length direction of the lighting strip. The via 64' is hidden because that lighting element connects to a different pair of corresponding conductive tracks. The via 64 shown in FIG. 2 in cross section extends down from a contact terminal 60 through a conductive track 22a of the second set and a corresponding conductive track 12a of the first set. The via 64 thus connects a terminal at the underside of the lighting element 50 to an associated conductive track 12a, 22a of each of the first and second sets.

Thus, the conductive tracks associated with a particular lighting element are electrically connected together and to the lighting element at each lighting element location. The electrically connected pairs of conductive tracks thus form a parallel pair of supply lines between each adjacent lighting element along the strip.

FIG. 3 shows a lighting element 50 connected to its two contact terminals 60, 61 and the respective two vias 64, 65. In this example the contact terminal of the lighting element extends across the lighting strip so that they are position over a desired conductive track. However, this is not essential, and the third layer may include conductive traces between any contact terminal location of the lighting element to the desired via location.

The lighting element 50 is in this way connected by a first via 64 to first conductive tracks 12a, 22a in each of the first and second layers, which for example function as a high supply line (i.e., a current supply line), and by a second via 65 to second conductive tracks 12b, 22b in each of the first and second layers, which for example function as a low supply line (i.e., a current return line).

The high supply line and the low supply line may be considered to have opposite polarity, regardless of the actual voltages present (e.g. the low supply lines may be ground).

The vias are partially buried vias which terminate at or just beneath the conductive tracks of the first layer 10. In this way, the vias 64, 65 do not extend to the bottom surface of the lighting strip. This bottom surface may thus function as an insulating support.

Figure 4:
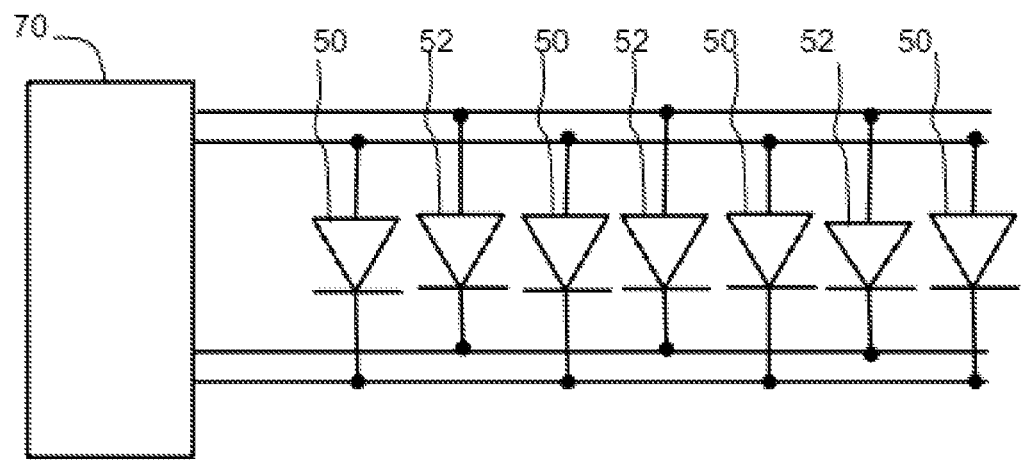
FIG. 4 shows one possible set of electrical connections for a two-channel arrangement.

FIG. 4 shows the electrical arrangement for the most simple implementation of the two-channel arrangement, with alternating lighting elements 50, 52, each connected in parallel between their associated pair of conductive tracks. The four conductive tracks are shown in FIG. 4—each one represents the parallel combination of the corresponding conductive tracks from the first and second layers of the printed circuit board.

Current is delivered to the lighting elements by a current driver 70. The current delivered should be sufficient that even after the voltage drops along the conductive tracks, a drive current is still available which is sufficient to illuminate the most distant lighting elements. However, the current at the lighting elements most proximal to the driver 70 should does not overdrive those nearest lighting elements.

Figure 5:
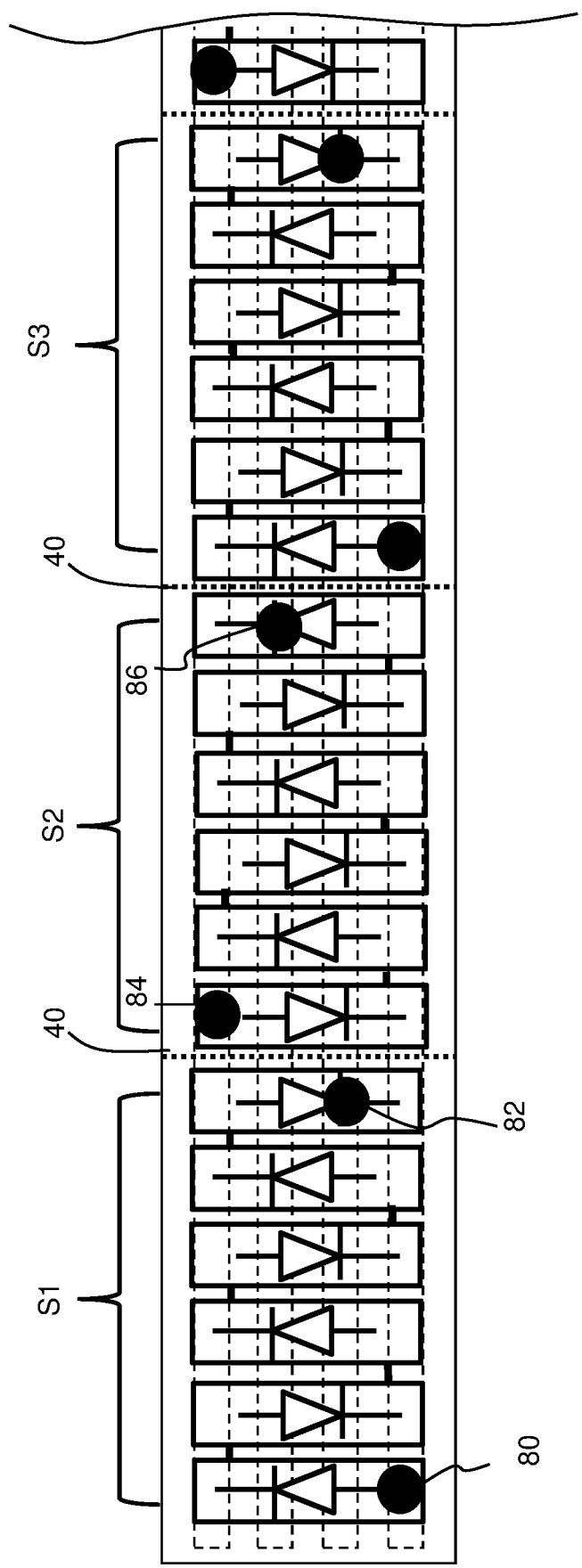
FIG. 5 shows another possible set of electrical connections for a two-channel arrangement.

FIG. 5 shows one possible arrangement which combines series and parallel connections of lighting elements.

A first series string S1 is shown with six series-connected lighting elements belonging to the first channel. The series connections are made using the third (top) layer of the printed circuit board. This third layer thus defines the contact terminals for the discrete lighting element chips as well as tracks for creating the interconnections between the lighting elements within the series strings. They may for example be 12 lighting elements in each string (six are shown to make the illustration clearer). Indeed there may be any desired number in each series string to reach a desired combined forward voltage.

At one end of the string, there is a via 80 for connection to one conductive track (in each of the first and second layers) and at the other end of the string there is a via 82 for connection to another conductive track (in each of the first and second layers). Thus, the string is connected between a positive and negative supply.

The next series string S2 is again shown with six series-connected lighting elements belonging to the second channel. The ends of the string thus connect to the other two conductive tracks (which form the power supply for the second channel) with associated vias 84, 86.

The pattern then repeats so that strings of alternating channels are disposed along the length of the lighting strip.

The perforation lines 40 are between the series strings so that the series connections are not broken when the lighting strip is broken to length.

Each string for example has an forward voltage of 36V. This corresponds to the fixed forward voltage window of the constant current driver, and it is the same regardless of the length to which the board is adjusted by breaking at a perforation.

The lighting strip for example has a width less than 20 mm, for example in the range width 8 mm to 12 mm. The invention enables two (or more channels) to be provided despite this narrow width, by duplicating conductive tracks the first and second layers of the printed circuit board.

The lighting strip may have a length more than 1000 mm. The length is for example 1210 mm (4 feet) or 1513 mm (5 feet) or any other length. The reduced resistance allows current to be supplied to lighting elements along the length of the lighting strip.

Each lighting element for example comprises an LED or an array of LEDs. Each lighting element (i.e. each surface mounted chip) may itself comprise a single lighting element or a series or parallel string of LEDs. Other solid state lighting elements may be used.

Each lighting element may be provided as a separate chip mounted on the printed circuit board. This facilitates a cost-effective manufacture of the lighting strip, e.g. using a SMD process.

A current driver has been shown, but voltage driving is also possible.

There may be one or more rows of lighting elements along the length (and hence across the width) of the lighting strip, and these rows may be straight or staggered.

The invention has been described with reference to two printed circuit board layers with corresponding conductive tracks. The approach may be extended to three or more layers, although with the consequent increase in cost and decrease in flexibility.

The invention thus relates generally to the use of multiple printed circuit board layers with corresponding and overlapping conductive tracks, for use in a printed circuit board that is designed to be broken along a perforation. The invention may however be applied with any suitable known driver, lighting technology, electrical circuit topology, and physical layout of the lighting elements along the lighting strip.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A lighting strip, comprising:
   a strip-shaped printed circuit board which includes:
      one or more perforated lines at which the printed circuit board length may be adjusted by breaking off an end portion of a printed circuit board;
      a first layer having a first set of conductive tracks;
      a second layer provided over the first layer, having a second set of conductive tracks corresponding to the first set of conductive tracks, wherein each conductive track of the second set is vertically aligned and positioned over the corresponding conductive track of the first set; and
      a third layer provided over the second layer, having an array of contact terminals; and
   a plurality of lighting elements disposed along the lighting strip, each electrically connected to a respective pair of the contact terminals;
   wherein the lighting strip comprises a set of vias connecting each conductive track of the first set to the corresponding conductive track of the second set.

2. The lighting strip of claim 1, wherein each conductive track of the second set is positioned over the corresponding conductive track of the first set over a full length of the conductive tracks.

3. The lighting strip of claim 1, wherein the lighting elements are grouped into a plurality of channels, each channel being associated with a first conductive track which functions as a high supply line and a second conductive track which functions as a low supply line of both the first and second sets of conductive tracks, on each of the first and second layers.

4. The lighting strip of claim 3, comprising two channels of lighting elements, a first channel comprising warm white lighting elements and a second channel comprising cool white lighting elements.

5. The lighting strip of claim 1, wherein the first and second layers have the same layout.

6. The lighting strip of claim 1, wherein each lighting element comprises an LED or an array of LEDs.

7. The lighting strip of claim 1, wherein each via connects a lighting element terminal to an associated conductive track of each of the first and second sets.

8. The lighting strip of claim 7, wherein each lighting element, or a series string of lighting elements, is connected by a first via to first conductive tracks in each of the first and second layers, which function as a positive supply line and by a second via to second conductive tracks in each of the first and second layers, which function as a negative supply line.

9. The lighting strip of claim 1, wherein the vias are partial buried vias which terminate at the conductive tracks of the first layer.

10. The lighting strip of claim 1, wherein the printed circuit board further comprises an insulating base layer beneath the first layer.

11. The lighting strip of claim 1, having a width less than 20 mm.

12. The lighting strip of claim 1, having a length more than 1000 mm.

13. The lighting strip of claim 1, further comprising a current driver circuit for delivering a current to the lighting elements from one end of the printed circuit board.

14. The lighting strip of claim 1, wherein the printed circuit board comprises a rigid printed circuit board.

* * * * *